United States Patent
Arnold et al.

(10) Patent No.: US 7,776,695 B2
(45) Date of Patent: Aug. 17, 2010

(54) SEMICONDUCTOR DEVICE STRUCTURE HAVING LOW AND HIGH PERFORMANCE DEVICES OF SAME CONDUCTIVE TYPE ON SAME SUBSTRATE

(75) Inventors: John C. Arnold, Ridgefield, CT (US); Dureseti Chidambarrao, Weston, CT (US); Ying Li, Newburgh, NY (US); Rajeev Malik, Pleasantville, NY (US); Shreesh Narasimha, Beacon, NY (US); Siddhartha Panda, Beacon, NY (US); Brian L. Tessier, Poughkeepsie, NY (US); Richard Wise, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 11/306,716

(22) Filed: Jan. 9, 2006

(65) Prior Publication Data
US 2007/0158753 A1    Jul. 12, 2007

(51) Int. Cl.
*H01L 21/8234* (2006.01)

(52) U.S. Cl. .................... 438/275; 257/E21.626

(58) Field of Classification Search .......... 257/E21.626; 438/275
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |

(Continued)

FOREIGN PATENT DOCUMENTS

| | | |
|---|---|---|
| JP | 64-76755 | 3/1989 |
| WO | WO 2005/119760 | 12/2005 |

OTHER PUBLICATIONS

F. Ootsuka, et al., "A Highly Dense, High-Performance 130nm node CMOS Technology for Large Scale System-on-a-Chip Applications", IEDM, pp. 23.5.1-23.5.4, 2000.

(Continued)

*Primary Examiner*—W. David Coleman
*Assistant Examiner*—Sun M Kim
(74) *Attorney, Agent, or Firm*—Joseph P. Abate; Daryl Neff (57) ABSTRACT

A method for making a semiconductor device structure, includes: providing a substrate; forming on the substrate a first gate with first spacers, a second gate with second spacers, respective source and drain regions of a same conductive type adjacent to the first gate and the second gate, an isolation region disposed intermediate of the first gate and the second gate, silicides on the first gate, the second gate and respective source and drain regions; forming additional spacers on the first spacers to produce an intermediate structure, and then disposing a stress layer over the entire intermediate structure.

17 Claims, 4 Drawing Sheets

U.S. PATENT DOCUMENTS

| | | | |
|---|---|---|---|
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,882,973 A * | 3/1999 | Gardner et al. | 257/E21.626 |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,063,681 A * | 5/2000 | Son | 438/303 |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,500,765 B2 * | 12/2002 | Kao et al. | 257/E21.626 |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 6,717,216 B1 | 4/2004 | Doris et al. | |
| 6,806,584 B2 | 10/2004 | Fung et al. | |
| 6,831,292 B2 | 12/2004 | Currie et al. | |
| 6,853,030 B2 * | 2/2005 | Yoshiyama et al. | 257/E21.626 |
| 6,869,866 B1 | 3/2005 | Chidambarrao et al. | |
| 6,890,808 B2 | 5/2005 | Chidambarrao et al. | |
| 6,890,824 B2 * | 5/2005 | Yamada et al. | 257/E21.626 |
| 6,930,030 B2 | 8/2005 | Rausch et al. | |
| 6,984,564 B1 * | 1/2006 | Huang et al. | 438/275 |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0262784 A1 | 12/2004 | Doris et al. | |
| 2005/0218455 A1 | 10/2005 | Maeda et al. | |
| 2005/0230756 A1 | 10/2005 | Chang et al. | |
| 2006/0128145 A1 * | 6/2006 | Chidambarrao et al. | 438/655 |
| 2006/0249794 A1 * | 11/2006 | Teh et al. | 257/369 |

OTHER PUBLICATIONS

Kern Rim, et al., "Transconductance Enhancement In Deep Submicron Strained-Si n-MOSFETs", International Electron Devices Meeting, 26, 8, 1, IEEE, Sep. 1998.

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and Its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors- Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation In Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

T. Sugii, "High-performance bulk CMOS technology for 65/45 nm nodes", Solid-State Electronics 50, 2006, pp. 2-9.

Fu-Liang Yang, "A 65nm Node Strained SOI Technology with Slim Spacer", IEEE, 2003, pp. 27.2.1-27.2.4.

PCT International Search Report (Form PCT/ISA/220), dated May 4, 2007, for International Application No. PCT/EP2006/069984, 5 pages.

* cited by examiner

LOWER STRESS
LOWER PERFORMANCE DEVICE

HIGHER STRESS
HIGHER PERFORMANCE DEVICE

FIG. 6

IMPACT OF RSPS THICKNESS ON CHANNEL STRESS
(SIMULATION IS BASED ON 50nm 1.2GPa STRESS FILM

- SIMULATION SHOWN WAS BASED ON 50nm 1.2GPa STRESS FILM (90nm EXAMPLE)

- FOR 3GPa FILM, WHICH IS USED FOR 65nm TECHNOLOGY, THE MAX CHANNEL STRESS WITH 15nm RSPS SPACER WILL BE ~625MPa WHILE A 30nm SPACER WILL GIVE ~400MPa, WHICH TRANSLATES INTO 15% Ieff (DRIVE CURRENT) CHANGE.

TOTAL SPACER DISTANCE FROM GATE (nm) - i.e. COMBINATION OF CONVENTIONAL SIDEWALL SPACERS SP AND ADDITIONAL SPACERS RSPS

SEMICONDUCTOR DEVICE STRUCTURE HAVING LOW AND HIGH PERFORMANCE DEVICES OF SAME CONDUCTIVE TYPE ON SAME SUBSTRATE

FIELD OF THE INVENTION

The present invention relates to methods for making Metal Oxide Semiconductor (MOS) device structures and, more particularly, for using spacers and films to affect channel stresses and performances of MOS Field Effect Transistors (e.g. nFETs, pFETs), and to the resulting device structures.

BACKGROUND OF THE INVENTION

Figure 8:
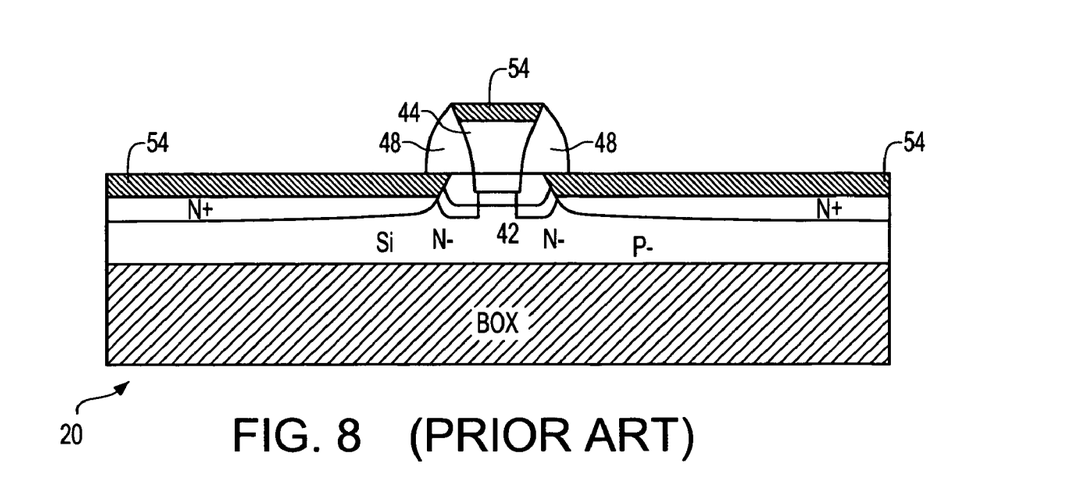
FIG. 8 is a side schematic view of an nFET according to the prior art.

MOSFETs and various methods of their manufacture are well known. Typically, a MOSFET includes source and drain regions at a surface formed in or on a suitable substrate, and a gate disposed therebetween. Silicide electrical layers or contacts are formed on the gate, and on the source and drain regions. In general, the typical known silicidation process is as follows: source and drain implants are done followed by a metal deposition and then an anneal to react the metal and implanted or doped silicon to form the silicide. Substrates include, for example, bulk semiconductor (e.g. silicon), silicon-on-insulator substrates (SOI), among other substrates. See, for example, U.S. Pat. No. 6,930,030 B2, METHOD OF FORMING AN ELECTRONIC DEVICE ON A RECESS IN THE SURFACE OF THIN FILM OF SILICON ETCHED TO A PRECISE THICKNESS, issued Aug. 16, 2005, by Rausch et al. which is hereby incorporated in its entirety by reference. FIG. 2M of the '030 patent, partially reproduced as FIG. 8 herein, shows a silicide layer/contact 54 disposed on a top surface of a polysilicon gate 44 of an nFET device 20 formed in an SOI substrate. Also shown are an oxide layer 42 disposed below the gate and spacers 48 disposed at sidewalls of the gate.

In CMOS technologies, nFET and pFET devices are optimized to achieve a required CMOS performance. Very different dopant species are used for nFET devices and pFET devices, accordingly. These species have very different physical properties such as a diffusion rate and a maximum activated concentration. In conventional CMOS technologies, the both nFET and the pFET usually share the same spacer process and topology. In order to optimize CMOS performance, the spacers typically can be of one maximum width and are designed to trade-off the performance between the nFET and the pFET. For example, if Arsenic and Boron are used as the source and drain dopants for the nFET and the pFET, respectively, it is known that a narrower spacer is better for the nFET but a much wider one is better for the pFET, because Arsenic diffuses much slower than Boron. In this case, the pFET is a limiting factor. Thus, the maximum width of all spacers is optimized for the pFET, trading-off the nFET performance.

It is also known to enhance performance of n-type field effect transistor devices (nFETs) and p-type field effect transistor devices (pFETs) by providing: tensile stresses to the channels of the nFETs and compressive stresses to the channels of the pFETs, and/or different spacer widths to control silicide distances from, for example, the channels.

See, for example, U.S. Pat. No. 6,869,866 B1, SILICIDE PROXIMITY STRUCTURES FOR CMOS DEVICE PERFORMANCE IMPROVEMENTS, by Chidambarrao et al., filed Sep. 22, 2003, issued Mar. 22, 2005; U.S. Pat. No. 6,890,808 B2, METHOD AND STRUCTURE FOR IMPROVED MOSFETS USING POLY/SILICIDE GATE HEIGHT CONTROL, by Chidambarrao et al., filed Sep. 10, 2003, issued May 10, 2005; and U.S. Pat. No. 6,806,584 B2, SEMICONDUCTOR DEVICE STRUCTURE INCLUDING MULTIPLE FETS HAVING DIFFERENT SPACER WIDTHS, by Fung et al., filed Oct. 21, 2002, issued Oct. 19, 2004, which are all hereby incorporated herein in their entireties by reference.

However, the present inventors believe that the methods and resulting device structures according to the prior art can be improved further, to provide both low and high performance devices of a same conductive type on a same substrate.

SUMMARY OF THE INVENTION

It is a principal object of the present invention to provide a method for making a low performance semiconductor device and a high performance semiconductor device of a same conductive type on one substrate, which method is readily compatible with conventional processes for making semiconductor device structures.

It is another object of the present invention to provide a semiconductor device structure including a low performance semiconductor device and a high performance semiconductor device both formed of nFETs.

It is a further object of the present invention to provide a semiconductor device structure including a low performance semiconductor device and a high performance semiconductor device both formed of pFETs.

According to the present invention, a method for making a semiconductor device structure, includes providing a substrate, forming on the substrate a first gate with first spacers, a second gate with second spacers, respective source and drain regions of a same conductive type adjacent to the first gate and the second gate, an isolation region disposed intermediate of the first gate and the second gate, silicides on the first gate, the second gate and respective source and drain regions, forming additional spacers on only the first spacers to produce an intermediate structure, and then disposing a stress layer over the entire intermediate structure.

Also according to the present invention, a semiconductor device structure, includes a first field effect transistor and a second field effect transistor disposed on a same substrate, the transistors being of a same conductive type and including respective sidewall spacers, additional spacers disposed only on the sidewall spacers of the first field effect transistor, and a stress film disposed on the first field effect transistor, the additional spacers and the second field effect transistor, so that a maximum stress resulting in the channel of the first field effect transistor is different than a maximum stress resulting in the channel of the second field effect transistor.

In one preferred embodiment of the present invention, the maximum stress resulting in the channel of the first field effect transistor is less than the maximum stress resulting in the channel of the second field effect transistor.

Further and still other objects of the present invention will become more readily apparent when the following detailed description is taken in conjunction with the following drawings, in which:

BRIEF DESCRIPTION OF THE DRAWINGS

the sidewall spacer SP and additional spacer RSPS have a combined maximum width W.

DETAILED DESCRIPTION OF THE PREFERRED EMBODIMENT

A preferred embodiment and best mode of the present invention will now be described with reference to FIGS. 1-7, for making a semiconductor device structure including two nFETs. However, it is understood by those skilled in the art in view of the instant disclosure that Applicant's method is applicable for producing a semiconductor device structure including two pFETs.

Figure 1:
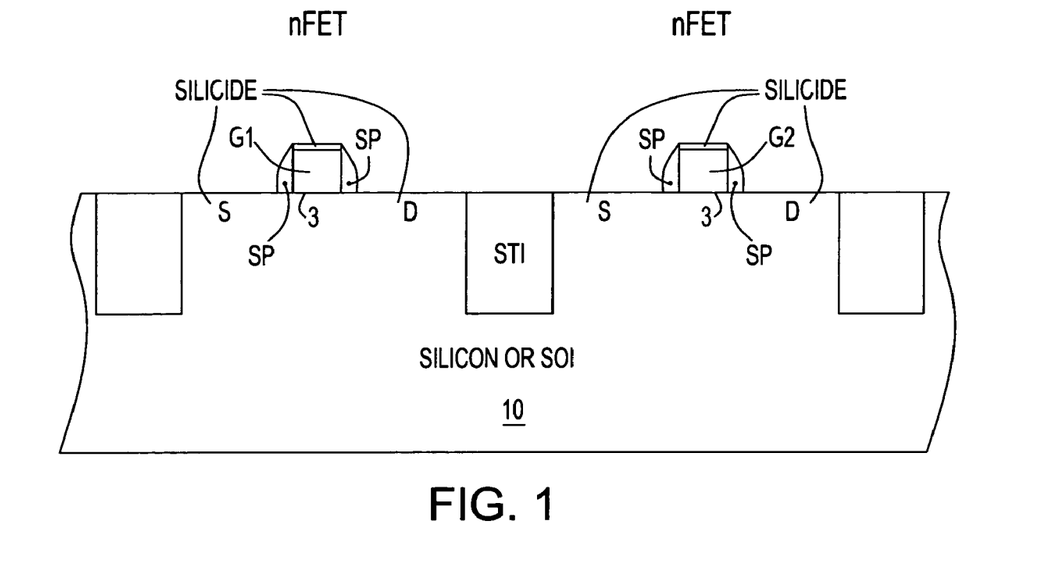
FIG. 1 through FIG. 5 are side schematic views of sequential semiconductor device structures resulting from the various sequential steps according to one preferred embodiment of the present invention, when used to make a two device structure including two nFETs having respective channels C.

Firstly, with reference to FIG. 1, provide a substrate 10 which has formed thereon a first gate G1 with first sidewall spacers SP, a second gate G2 with second sidewall spacers SP, respective and suitably implanted source and drain regions S, D formed adjacent to the first gate and the second gate, an isolation region STI disposed intermediate of the first gate G1 and the second gate G2, and suicides disposed on the first gate, the second gate and respective source and drain regions.

The semiconductor substrate 10 is, for example, a bulk silicon (Si) substrate or a silicon-on-insulator (SOI) substrate. Alternatively, the substrate 10 is a hybrid substrate which includes more than one surface orientation. The substrate alternatively includes a semiconductor material other than Si, such as Ge or any combination of Group III-V elements or Group II-V elements.

After an initial substrate cleaning procedure (conventional), an isolation scheme is carried out. As is well known in semiconductor manufacturing, the isolation scheme is used to separate selected semiconductor devices electrically from each other. The isolation scheme is a standard or a modified shallow trench isolation (STI) scheme. An isolation region STI is shown in FIG. 1. Alternatively, the isolation is accomplished using a LOCOS process or mesa isolation scheme, as is well known in the art of fabricating semiconductor devices. For various known or conventional processes for fabricating semiconductor devices, see for example VLSI Technology, $2^{nd}$ Edition, by S. M. Sze, (McGraw Hill Publishing Co., 1988).

After the isolation region STI is formed, a conventional gate oxide pre-cleaning process is performed. As is the case in known high performance (e.g., logic) or low performance (e.g., memory or analog) fabrication processes, various conventional gate oxide processes may be used to fabricate devices having different gate oxide thicknesses. A gate oxide 3 is formed, for example, using a conventional thermal oxidation process. The gate oxide 3 is formed using $N_2O$, NO, $O_2$ or any combination of them. The oxide 3 may be nitridized using a conventional plasma process. Alternatively, the gate oxide 3 is formed using a base oxide followed by deposition of a high k gate dielectric material such as aluminum oxide, or hafnium oxide, or another high k gate dielectric. The gate dielectric material has, for example, one approximately (+10%) uniform thickness selected from a range of about (+10%) 0.6 nm to about 7 nm.

Next, the gate electrodes or gates G1, G2 are formed conventionally. Preferably, each gate G1, G2, is formed from a polysilicon layer (not shown) deposited by a low pressure chemical vapor deposition (LPCVD) using a reactant gas such as silane ($SiH_4$). The thickness of the layer is between about 1000 and 3000 Angstroms. The layer is then conductively doped n-type by ion implanting arsenic ($As^{75}$) or phosphorus ($P^{31}$). The final dopant concentration of the layer after implantations is preferred between about 1.0 E 18 and 1.0 E 21 ions/$cm^3$. Conventional photolithographic techniques and anisotropic plasma etching are used to pattern the polysilicon layer which includes forming the gate electrodes over the device areas. The polysilicon layer is plasma etched using a reactive ion etching (RIE) or a high density plasma (HDP) etching and an etchant gas such as chlorine ($Cl_2$).

After removing the photoresist mask (not shown), for example, by plasma etching in oxygen ($O_2$), lightly doped source and drain (LDD) or extension areas (not shown) are formed in the device areas adjacent to said gate electrodes by ion implantation, using a second conductive type dopant, such as As or P. Polysilicon sidewall reoxidation or offset spacers could be used to offset the LDD implants. Typically, the LDD areas are doped to a concentration of between about 1.0 E 19 and 5.0 E 20 atoms/$cm^3$. Next, a conformal insulating layer (not shown) is deposited using conventional techniques and anisotropically plasma etched back to form sidewall spacers SP on the sidewalls of the gate electrodes G1,G2. Typically, the insulating layer is silicon oxide ($SiO_2$) and is deposited by a low pressure CVD (LPCVD) using tetraethosiloxane (TEOS) as the reactant gas, and is deposited to a preferred thickness of about 200 to 1000 Angstroms. Other options include nitride spacers or a combination of multiple spacers with nitride and oxide materials.

A conventional etch back is then carried out using RIE and an etchant gas such as carbon tetrafluoride ($CF_4$) and hydrogen $H_2$ or methylfluoride ($CHF_3$), which etches the $SiO_2$ layer selectively to the silicon substrate and polysilicon gate electrodes. Heavily doped source and drain contact areas S,D are then formed in the device areas adjacent to the insulating sidewall spacers SP by ion implanting a second conductive type dopant, such as arsenic. The contact areas are doped to a final concentration of 1.0 E 18 and 1.0 E 21 atoms/$cm^3$. Any residual native oxide remaining on the source and drain contact areas and the exposed top surface of the polysilicon gate electrodes is removed, for example, using a dip etch in a dilute hydrofluoric acid solution.

Both nFETs are then silicided in any conventional fashion, so that suicides are formed at locations as shown in FIG. 1. More details for the structure of FIG. 1 are shown, for example, in the prior art nFET device structure shown in FIG. 8 and described in U.S. Pat. No. 6,930,030 B2 previously incorporated herein by reference.

The foregoing description for FIG. 1 is with respect to nFETs. Of course, it is understood by those skilled in the art in view of the instant disclosure that the polarity type of dopants is reversed when pFETs are used, and that conventional masking, patterning etc. are required during processing.

Figure 2:
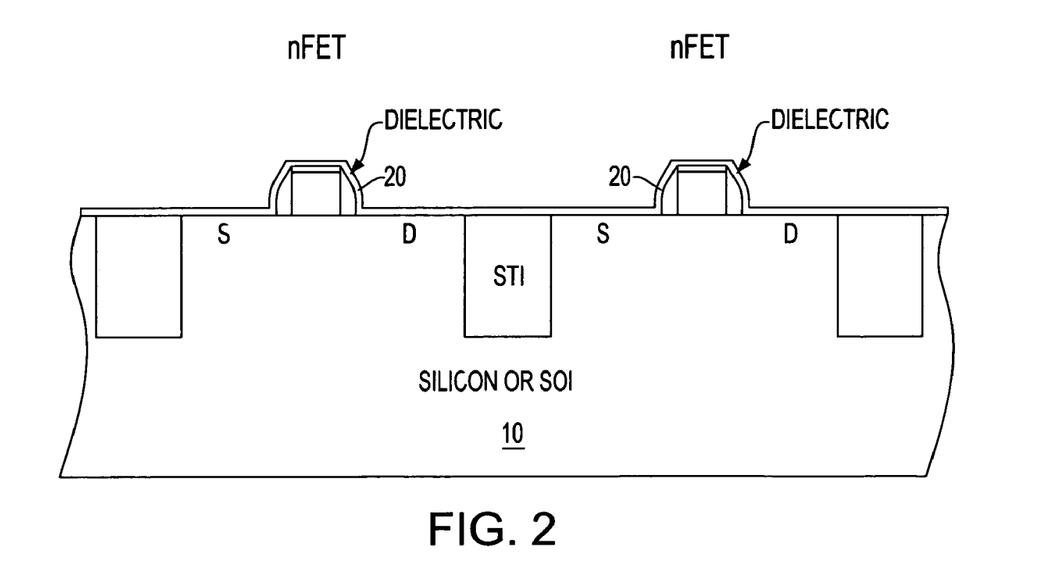

Next, referring to FIG. 2, a first conformal dielectric layer or film 20 is deposited on the substrate 10. More specifically, deposit the layer 20 over the silicided first gate with first spacers SP, the silicided second gate with second spacers SP, silicided respective source and drain regions, and the isolation region STI. The layer 20 is preferably silicon nitride and is deposited to one approximately (±10%) uniform thickness selected from a range of thickness of about 20 nanometers to about 70 nanometers. For example, the $Si_3N_4$ can be deposited by CVD, HDP, ALD or other conventional deposition techniques.

Figure 3:
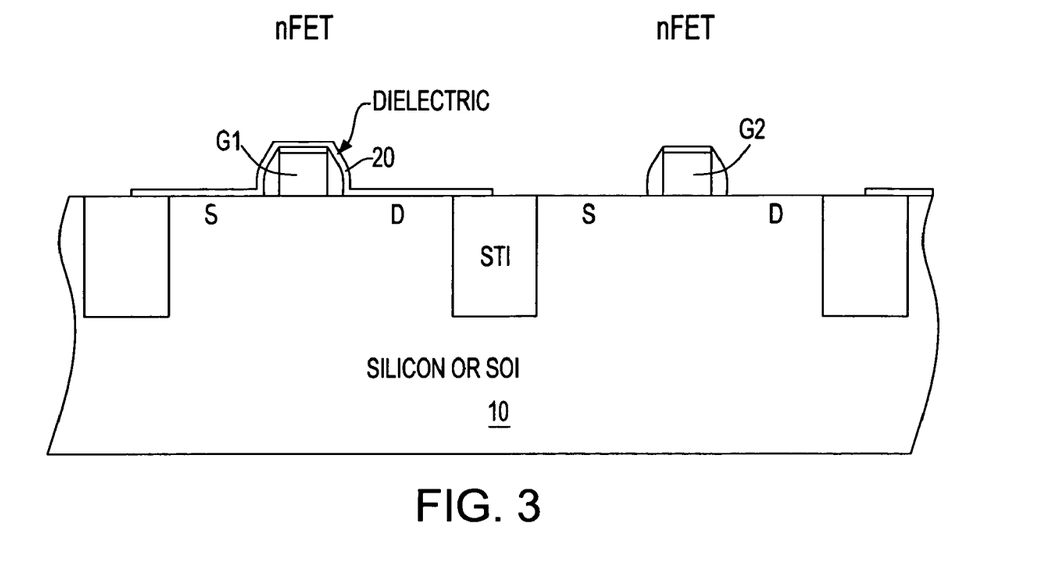

Next, referring to FIG. 3, cover the dielectric layer 20 disposed over the silicided first gate G1 with first spacers SP, the silicided respective source and drain regions S,D and a portion of the STI region. Covering is accomplished, for example, by means of depositing a conventional photoresist mask (not shown).

Then, remove the layer 20 from the uncovered areas—i.e. the silicided second gate G2 with spacers, silicided respective source and drain regions and a portion of the STI region. The resulting structure is shown in FIG. 3. Removal is accomplished, for example, by means of a conventional RIE. Next, remove the photoresist mask (not shown) using any conventional technique such as stripping or etching.

Figure 4:
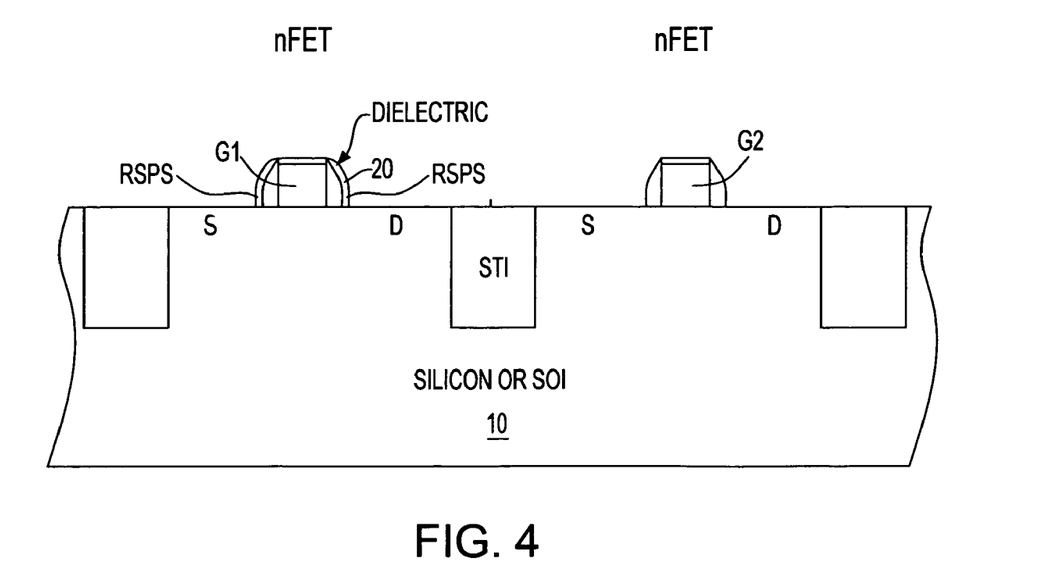

After removing the photoresist mask, cover the silicided gate G2 with spacers, adjacent silicided regions S,D and another portion of the STI region. A conventional photoresist mask (not shown) is used to cover the silicided gate G2 etc. Then, selectively remove the layer 20 from the silicided gate G1, silicided S,D, STI and the spacers SP, except for portions of the layer 20 disposed on the spacers SP as shown in FIG. 4, to form additional spacers or reverse stress proximity spacers RSPS on only the spacers SP for the nFET having the silicided gate G1. Preferably, for one device, a combined maximum width (2w) of the spacers RSPS and sidewall spacers SP is not greater than 50 nm for 90 nm process technology or not greater than 30 nm for 65 nm process technology. Removal of the layer 20 is effected by means of any conventional etch such as RIE.

Figure 5:
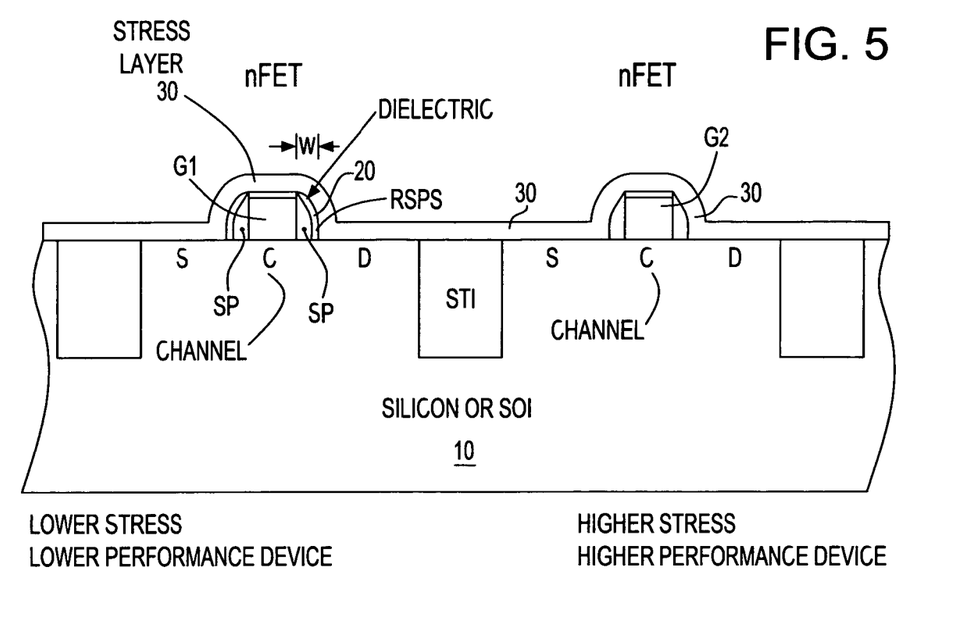
Figure 6:
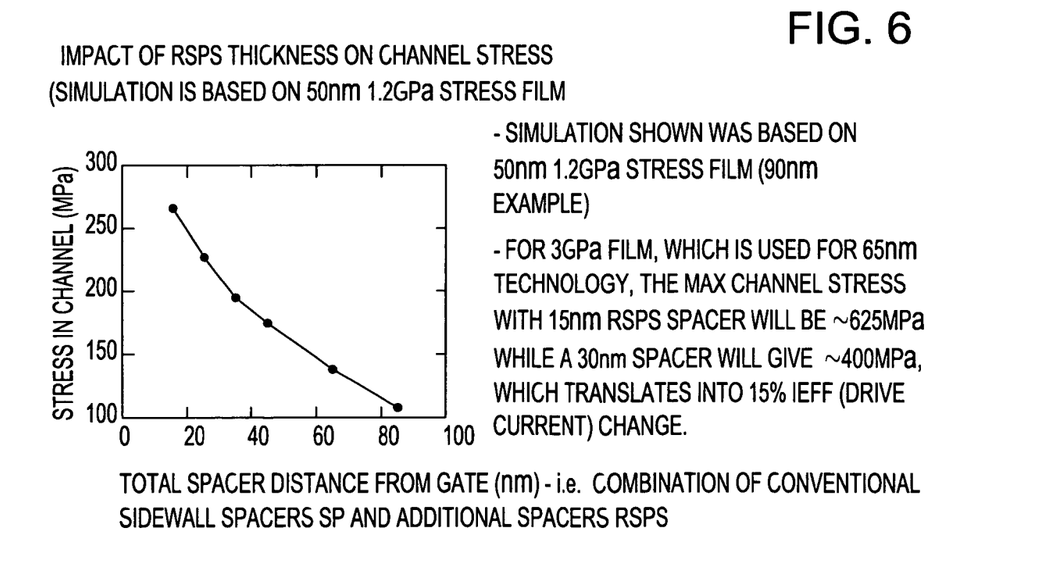
FIG. 6 is a diagram with explanatory legends showing a relationship between a maximum resulting stress in the channel of one device verses a combined maximum width (2w) of both additional spacers RSPS and both conventional sidewall spacers (SP), for 90 nm technology and a 50 nm 1.2 GPa stress film 30.

After forming the additional spacers RSPS, deposit a suitable stress film or layer 30 over the entire intermediate structure to form the semiconductor device structure shown in FIG. 5. The layer 30 is, for example, a silicon nitride or a silicon carbide and is conformally deposited to one approximately (±10%) uniform thickness selected from a range of thickness of about 10 nm to about 100 nm. For compositions of various stress films or layers, and deposit ion techniques, see, for example: "A Highly Dense, High-Performance 130 nm node CMOS Technology for Large Scale System-on-a-Chip Applications", by F. Ootsuka et al., IEDM, 2000, pages 23.5.1-23.5.4.

Thus, in general, the method according to the present invention selectively forms spacers RSPS on an FET after silicidation to control a proximity of a stress liner/layer and, thus, mobility/drive current for the FET device.

The layer 30, sidewall spacers SP and additional spacers RSPS contribute to create a suitable first stress in the channel C of the device having the silicided gate G1. See, for example, the diagram of FIG. 6. As understood from FIG. 5 and FIG. 6, the first stress is different (preferably, less) than the stress created in the channel C of the device having the silicided gate G2.

Figure 7:
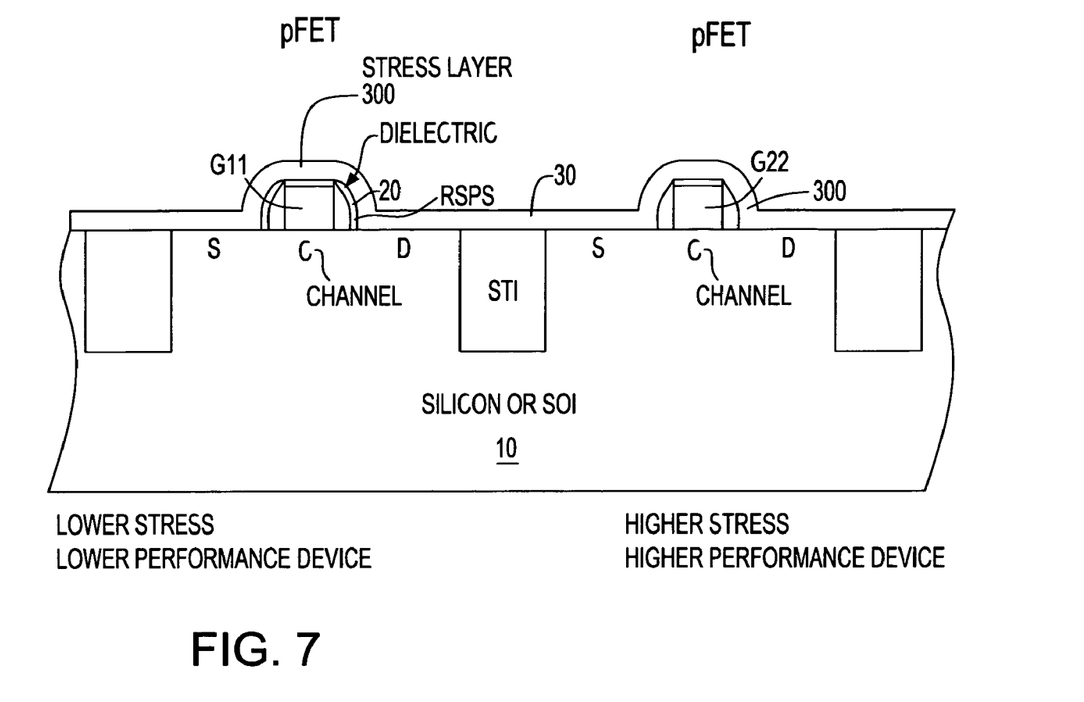
FIG. 7 is a side schematic view of a semiconductor device structure according to the present invention including two pFETs.

FIG. 7 is a schematic diagram of a resulting semiconductor device structure including two pFETs having silicided gates G11, G22, spacers RSPS disposed only on the sidewall spacers of the gate G11, and a stress layer 300 disposed over the entire structure.

While the invention has been particularly shown and described with reference to the preferred embodiments thereof, it will be understood by those skilled in the art that various changes in form and details may be made without departing from the spirit and scope of the invention.

What is claimed is:

1. A method for making a semiconductor device structure, comprising:
   forming on a substrate a first gate with first spacers, a second gate with second spacers, respective source and drain regions of a same conductive type adjacent to the first gate and the second gate, an isolation region disposed intermediate of the first gate and the second gate, silicides on the first gate, the second gate and respective source and drain regions;
   after said forming, then forming additional spacers on only the first spacers to produce an intermediate structure, and then disposing a stress layer over the entire intermediate structure, including:
   disposing a first dielectric layer over the silicided first gate with first spacers, the silicided second gate with second spacers, silicided respective source and drain regions, and the isolation region, and
   covering the first dielectric layer disposed over the silicided first gate with first spacers, the silicided respective source and drain regions adjacent to the first gate, and a portion of the isolation region, and then removing the first dielectric layer from portions of the structure not covered by said covering step so that the silicide on the first gate is lower than portions of the first dielectric layer; and then disposing a stress layer over the entire intermediate structure.

2. The method as claimed in claim 1, said step of removing comprising anisotropically etching the first dielectric layer from the portions of the structure.

3. The method as claimed in claim 1, further comprising:
   uncovering the first dielectric layer disposed over the silicided first gate with spacers, and the silicided respective source and drain regions adjacent to the first gate, and the portion of the isolation region;
   covering the second dielectric layer disposed over the silicided second gate with second spacers, the silicided respective source and drain regions adjacent to the second gate and another portion of the isolation region; and then
   removing the first dielectric layer except from certain portions disposed on the first spacers to form the additional spacers.

4. The method as claimed in claim 2, said step of anisotropically etching comprising reactive ion etching the first dielectric layer.

5. The method as claimed in claim 1, wherein the first spacers have a maximum width of not greater than 60 nanometers.

6. The method as claimed in claim 1, wherein each of the additional spacers has a maximum width selected from the group consisting of 15 nm, 30 nm and 50 nm.

7. The method as claimed in claim 1, said step of disposing further comprising depositing a stress layer selected from the group consisting essentially of silicon nitride and silicon carbide.

8. The method as claimed in claim 1, said step of disposing the first dielectric layer further comprising depositing the first dielectric layer from the group consisting essentially of silicon nitride, silicon carbide and silicon dioxide.

9. The method as claimed in claim 1, wherein the first spacers and the first dielectric layer together have a maximum thickness of not greater than 70 nm.

10. The method as claimed in claim 1, wherein the same conductive type is n-type.

11. The method as claimed in claim 1, wherein the same conductive type is p-type.

12. The method as claimed in claim 1, wherein the additional spacers overlie portions of the silicides formed on the source and drain regions adjacent to the first gate.

13. The method as claimed in claim 1, wherein the first gate, the source and drain regions adjacent to the first gate, and a channel region underlying the first gate between the source and drain regions adjacent thereto define a transistor, wherein an amount of stress applied by the stress layer to the channel region of the transistor is reduced in relation to a thickness of the additional spacers.

14. The method as claimed in claim 13, wherein the transistor is a first transistor and the second gate, the source and drain regions adjacent to the second gate, and a channel region underlying the second gate between the source and drain regions adjacent thereto define a second transistor, wherein an amount of stress applied by the stress layer to the channel region of the second transistor is greater than the amount of stress applied by the stress layer to the channel region of the first transistor.

15. A method for making a semiconductor device structure, comprising:
  a) forming a first gate with first spacers, a second gate with second spacers, first source and drain regions adjacent to the first gate, and second source and drain regions adjacent to the second gate, an isolation region between the first gate and the second gate, and silicide regions on the first gate, the second gate and the first and second source and drain regions, wherein the second source and drain regions have a same conductive type as the first source and drain regions;
  b) after step (a), then forming third spacers overlying the first spacers and not overlying the second spacers, the third spacers overlying the first source and drain regions and the silicide regions thereon; and
  c) then disposing a stress layer over the first and second gates, the first, second and third spacers, the first source and drain regions and the silicide regions thereon, and the second source and drain regions and the silicide regions thereon, the stress layer contacting the second spacers, wherein the third spacers space at least portions of the stress layer apart from the first spacers.

16. The method as claimed in claim 15, wherein the first gate, the first source and drain regions, and a channel region underlying the first gate define a transistor, wherein an amount of stress applied by the stress layer to the channel region of the transistor is reduced in relation to a thickness of the third spacers.

17. The method as claimed in claim 16, wherein the transistor is a first transistor, and the second gate, the second source and drain regions, and a channel region underlying the second gate define a second transistor, wherein an amount of stress applied by the stress layer to the channel region of the second transistor is greater than the amount of stress applied by the stress layer to the channel region of the first transistor.

* * * * *